(12) United States Patent
Mizuo (10) Patent No.: US 11,621,615 B2
(45) Date of Patent: Apr. 4, 2023

(54) MOTOR DRIVE DEVICE

(71) Applicant: CANON KABUSHIKI KAISHA, Tokyo (JP)

(72) Inventor: Yoshihiro Mizuo, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 205 days.

(21) Appl. No.: 17/095,263

(22) Filed: Nov. 11, 2020

(65) Prior Publication Data

US 2021/0152055 A1 May 20, 2021

(30) Foreign Application Priority Data

Nov. 18, 2019 (JP) .............................. JP2019-207645

(51) Int. Cl.
| | |
|---|---|
| *H02K 11/215* | (2016.01) |
| *H02K 41/03* | (2006.01) |
| *G01R 33/07* | (2006.01) |
| *H02K 29/08* | (2006.01) |
| *H02P 6/00* | (2016.01) |

(52) U.S. Cl.
CPC ........... *H02K 11/215* (2016.01); *G01R 33/07* (2013.01); *H02K 29/08* (2013.01); *H02K 41/031* (2013.01); *H02P 6/006* (2013.01)

(58) Field of Classification Search
CPC .... H02K 11/215; H02K 29/08; H02K 41/031; G01R 33/07; H02P 6/006
See application file for complete search history.

(56) References Cited

U.S. PATENT DOCUMENTS

| | | | | |
|---|---|---|---|---|
| 2009/0189552 | A1* | 7/2009 | Mizumaki | H02P 6/08 318/400.1 |
| 2009/0251777 | A1* | 10/2009 | Suzuki | G02B 27/646 359/554 |
| 2014/0049200 | A1* | 2/2014 | Ueyama | H02P 8/14 318/400.14 |
| 2015/0022139 | A1* | 1/2015 | Yamanaka | H02P 8/14 318/696 |
| 2016/0366339 | A1* | 12/2016 | Shimoyama | H04N 5/23287 |
| 2018/0331641 | A1* | 11/2018 | Ishikawa | H02P 8/18 |
| 2019/0092382 | A1* | 3/2019 | Kogure | B62D 5/0409 |

FOREIGN PATENT DOCUMENTS

JP 2012-090467 A 5/2012

* cited by examiner

*Primary Examiner* — Zoheb S Imtiaz
(74) *Attorney, Agent, or Firm* — Canon U.S.A., Inc. IP Division (57) ABSTRACT

A motor drive device enabling efficient position control at a low cost is provided. The motor drive device includes a position detection unit configured to detect a current position of an object to be driven by a motor and a motor control unit configured to calculate an output control amount for the motor based on a deviation between the current position and a target position of the object to be driven by the motor while changing an advance angle in a rotational phase of the motor according to the output control amount when the advance angle is within a predetermined advance angle range in the rotational phase of the motor and changing a drive voltage of the motor with the advance angle fixed when the advance angle is outside the predetermined advance angle range.

14 Claims, 12 Drawing Sheets

MOTOR DRIVE DEVICE

BACKGROUND

Field of the Disclosure

The present disclosure relates to a motor drive device and more particularly to a technique for efficiently driving a motor.

Description of the Related Art

In the related art, there are techniques in which a position detection mechanism is provided on a motor and an efficient drive voltage signal is provided to the motor based on a detected current position. Among them is a position control technique which aims to move a member attached to a motor to a desired position. Japanese Patent Laid-Open No. 2012-90467 discloses a technique for performing detailed position control using a linear motor and a position detector.

However, in Japanese Patent Laid-Open No. 2012-90467, there are issues in that a process of generating a drive voltage signal from a position detection signal is limited, the phase difference between a detected position signal and a generated waveform for driving cannot be manipulated, and there is room for manipulating the control of voltage and phase differences in position control in the course of moving toward a target position. Further, there is an issue that magnet members are large and the cost tends to be high since the motor is a linear motor.

SUMMARY

Embodiments of the present disclosure provide a motor drive device enabling efficient position control at a low cost. A motor drive device according to embodiments of the present disclosure includes at least one processor or circuit configured to function as a position detection unit configured to detect a current position of an object to be driven by a motor and a motor control unit configured to calculate an output control amount for the motor based on a deviation between the current position and a target position of the object to be driven by the motor while changing an advance angle in a rotational phase of the motor according to the output control amount in a case where the advance angle is within a predetermined advance angle range in the rotational phase of the motor and changing a drive voltage of the motor with the advance angle fixed in a case where the advance angle is outside the predetermined advance angle range.

Further features of the present disclosure will become apparent from the following description of exemplary embodiments with reference to the attached drawings.

BRIEF DESCRIPTION OF THE DRAWINGS

FIGS. 2A to 2C are diagrams for explaining an exemplary arrangement of a rotary magnet and Hall elements in the first embodiment, where

FIGS. 3A to 3E are diagrams for explaining a position ENC circuit and a drive waveform generation circuit of the first embodiment, where FIG. 3D is a diagram showing the output of a stationary phase difference setting unit 305 or the like, and FIG. 3E is a diagram showing a value obtained by offsetting the waveform of FIG. 3D.

FIGS. 4A to 4C are diagrams showing the relationship between position detection sensor signals and a detected position count in the first embodiment, where

FIGS. 5A and 5B are diagrams showing the relationship between drive waveforms and PWM in the first embodiment, where

FIGS. 6A and 6B are flowcharts showing a flow of a process of the first embodiment, where

FIGS. 7A to 7D are diagrams showing the relationship between an advance angle, a voltage, a torque, and the like, where

FIGS. 8A to 8C are diagrams showing the relationship between a control amount, the advance angle, the voltage, and the torque in the first embodiment, where

FIGS. 10A and 10B are diagrams showing an outline of a mechanism of a system according to the second embodiment, where

DESCRIPTION OF THE EMBODIMENTS

Hereinafter, embodiments of the present disclosure will be described with reference to the accompanying drawings.

In the drawings, the same members or elements are denoted by the same reference numerals and duplicate descriptions will be omitted or simplified.

First Embodiment

Figure 1:
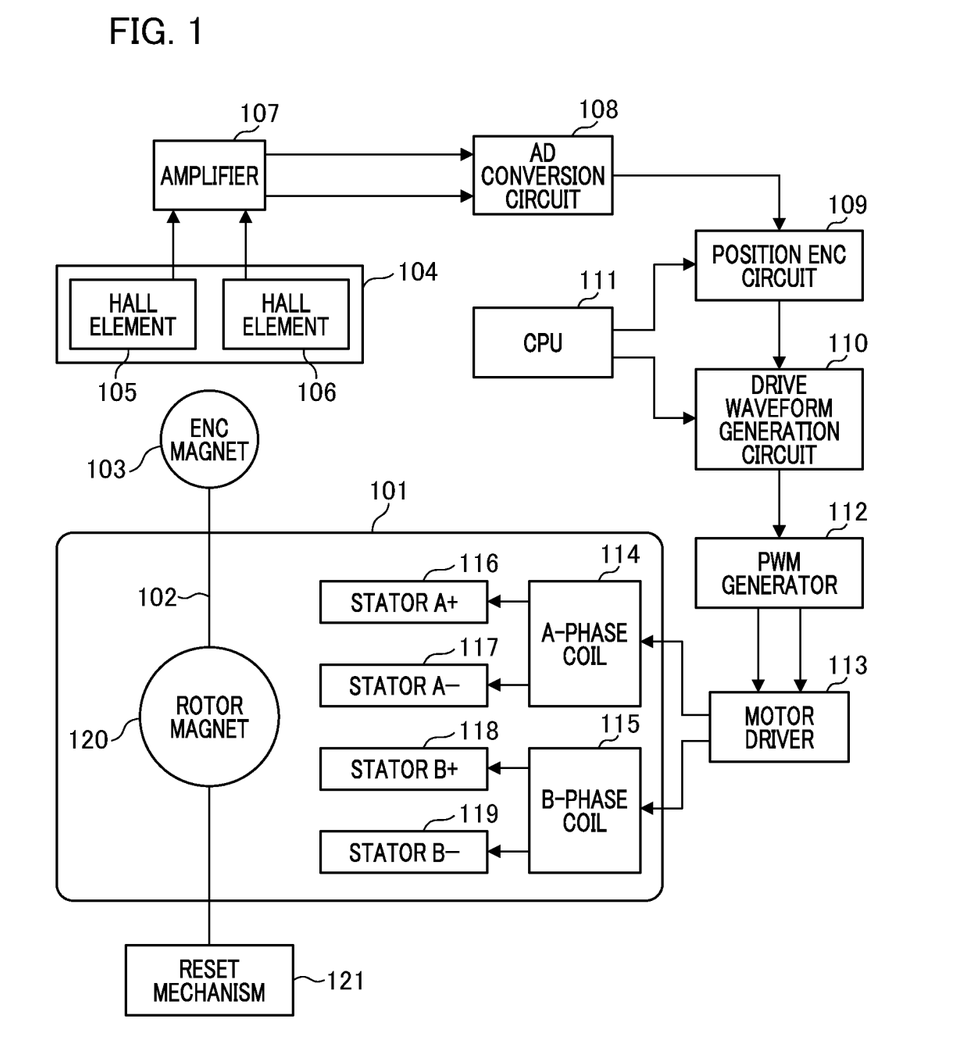
FIG. 1 is a system block diagram of a motor drive device according to a first embodiment of the present disclosure.

A motor drive device according to a first embodiment of the present disclosure will be described below in detail with reference to the accompanying drawings. FIG. 1 is a system block diagram of the motor drive device according to the first embodiment.

A motor 101 such as a stepping motor is provided with an encoder (ENC) magnet 103 as a rotary magnet on a rotor shaft 102 and a reset mechanism 121. As shown in FIG. 2B, the ENC magnet 103 is magnetized with a plurality of magnetic poles such that sinusoidal magnetic fields are generated on the circumference thereof according to the rotational position. The reset mechanism 121 is configured to output a signal that changes at a predetermined rotational phase of the rotor shaft 102 and serves to provide a reference for an absolute value of the rotational position of the motor.

The reset mechanism 121 of the present embodiment is specifically configured as follows. That is, a screw is attached to the rotor shaft 102 which has a moving body that engages with a threaded portion of the screw and moves in translation as the screw rotates. The moving body has a slit such that a PI output signal is changed when the slit passes through a photo interrupter (PI) arranged at a reset position.

A Hall element package 104 includes two Hall elements 105 and 106. The Hall elements 105 and 106 can detect and output changes in magnetic fields due to rotation of the ENC magnet 103 at their arranged positions. The Hall elements 105 and 106 function as a position detection unit for detecting the rotational phase of the rotary magnet to detect the current rotational position of the object to be driven by the motor (the rotary magnet).

Figure 2A:
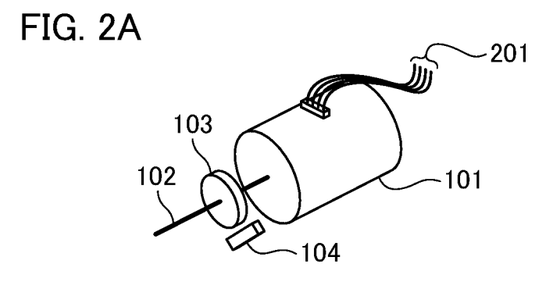
FIG. 2A is a diagram showing the exterior of the configuration of a Hall element package 104.
Figure 2B:
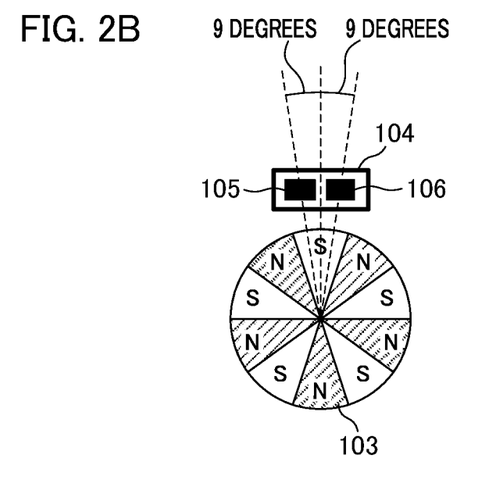
FIG. 2B is a diagram showing an exemplary mechanical arrangement of an ENC magnet 103 and Hall elements 105 and 106.
Figure 2C:
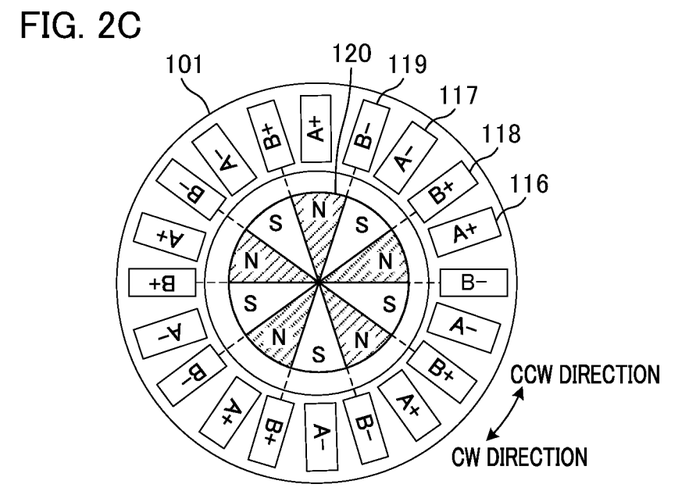
FIG. 2C is a diagram showing an arrangement relationship between stators and a rotor magnet.

FIGS. 2A to 2C are diagrams showing an exemplary arrangement of the rotary magnet and the Hall elements in the first embodiment. FIG. 2A is a diagram showing the exterior of the configuration of the Hall element package 104. A short cylindrical ENC magnet 103 is installed on the rotor shaft 102 of the motor 101 and the Hall element package 104 is mechanically arranged at a position where it can detect magnetic fields. A wiring 201 extends out of the motor 101 and is connected to a motor driver 113 which will be described later.

FIG. 2B is a diagram showing an exemplary mechanical arrangement of the ENC magnet 103 and the Hall elements 105 and 106. The ENC magnet 103 is a magnet having ten poles with five N-pole regions and five S-pole regions, each of which is magnetized over an angular region of 36 degrees.

The Hall elements 105 and 106 are arranged equidistant from the center position of the ENC magnet 103 when viewed from the center position such that the two Hall elements physically have an angle of 18 degrees therebetween with respect to the center position. Signals detected by the Hall elements have a phase difference of 90 degrees.

The amplifier 107 in FIG. 1 amplifies weak signals from the Hall elements and sends the resulting signals to the AD conversion circuit 108 at a downstream stage. The AD conversion circuit 108 converts voltage signals input from the upstream stage into numerical values and sends the conversion result to the position ENC circuit 109 as a digital numerical signal. The position ENC circuit 109 has a mechanism for adjusting the offset and gain of the signals from the two Hall elements which have been input from the upstream stage. After this adjustment, the position ENC circuit 109 generates a tangent (TAN) value from the two signals and then performs an inverse TAN (arc tangent) calculation to generate rotational angle information. The rotational angle information is integrated to generate rotational position information.

The generated rotational position information is sent to a drive waveform generation circuit 110. The drive waveform generation circuit 110 has a function of generating drive waveforms for the motor. The drive waveform generation circuit 110 can switch between OPEN driving of outputting sinusoidal signals for driving with different phases at a set frequency and CLOSED driving of outputting drive waveforms interlocked with the position ENC circuit 109. The drive waveform generation circuit 110 performs this switching according to a command from a CPU 111. The CPU 111 can perform setting of the frequency and amplitude gain values of output sinusoidal signals during OPEN driving, initialization setting of a position count value of the position ENC circuit 109, and the like. The CPU 111 which is a computer functions as a control unit that performs various overall operations of the device based on a computer program stored in a memory (not shown).

Here, the processing of the position ENC circuit 109 and the drive waveform generation circuit 110 will be described in detail with reference to FIGS. 3 and 4. FIGS. 3A to 3E are diagrams for explaining the position ENC circuit and the drive waveform generation circuit according to the first embodiment. FIGS. 4A to 4C are diagrams showing the relationship between position detection sensor signals and a detected position count according to the first embodiment.

Figure 3A:
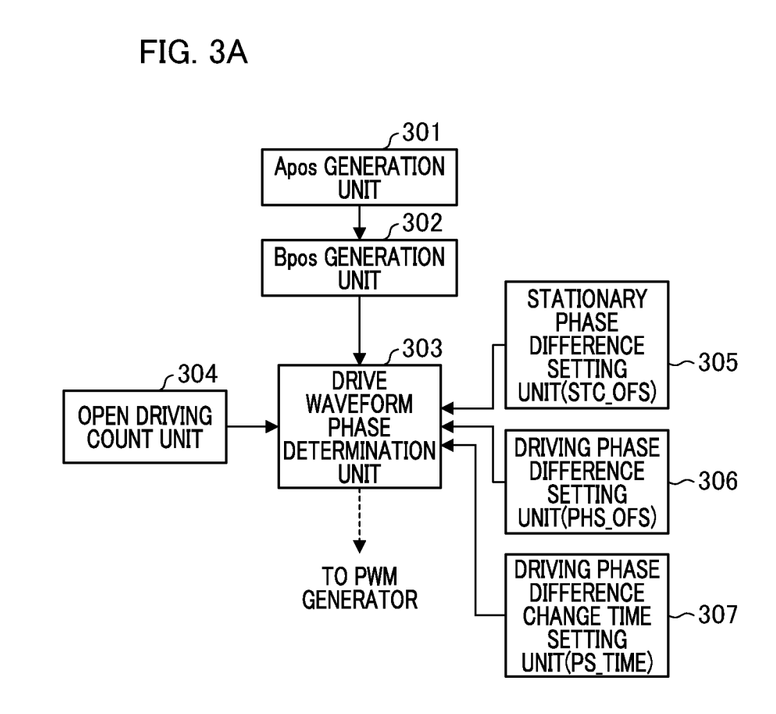
FIG. 3A is a block diagram showing in detail the processing of a position ENC circuit 109 and a drive waveform generation circuit 110.

FIG. 3A is a block diagram showing in detail the processing of the position ENC circuit 109 and the drive waveform generation circuit 110. An A-position (Apos) generation unit (circuit) 301 and a B-position (Bpos) generation unit (circuit) 302 correspond to the position ENC unit (circuit) 109. Further, components from a drive waveform phase determination unit (circuit) 303 to a driving phase difference change time setting unit (circuit) 307 correspond to the drive waveform generation unit (circuit) 110. In the present embodiment, the units 301 to 307 may be formed of discrete electronic circuits or some or all may be formed of an FPGA, a CPU or the like.

Two Hall element signals (Hall element signal 1 and Hall element signal 2) are input to the AD conversion circuit 108 and the conversion result is passed to the Apos generation unit 301. As preprocessing, the Apos generation unit 301 adjusts the offsets and gains of the two input signals such that the offsets and gains of the two signals are the same. The peak and bottom values of the two signals are detected while rotating the motor with OPEN driving, and the Apos generation unit 301 performs the adjustment by referring to the detection result.

After the adjustment, the Apos generation unit 301 can generate a TAN value using two sinusoidal signals with a phase difference of 90 degrees and perform an inverse TAN calculation of the TAN value to generate rotational angle information and then calculate an integral of this rotational angle information to generate rotational position information.

Figure 3B:
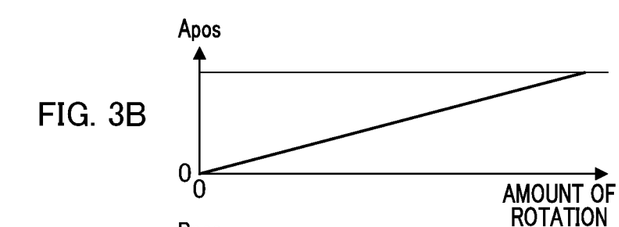
FIG. 3B is a diagram showing the output of an Apos generation unit 301.
Figure 4A:
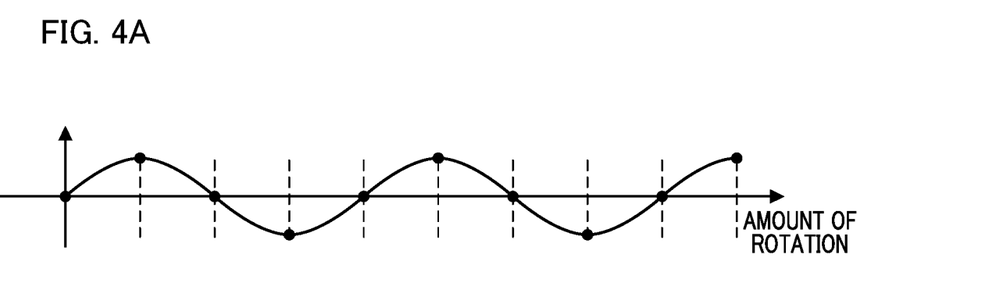
FIGS. 4A and 4B are diagrams showing signals obtained by adjusting detected Hall element signals and FIG. 4C is a diagram showing the output of the Apos generation unit 301.
Figure 4B:
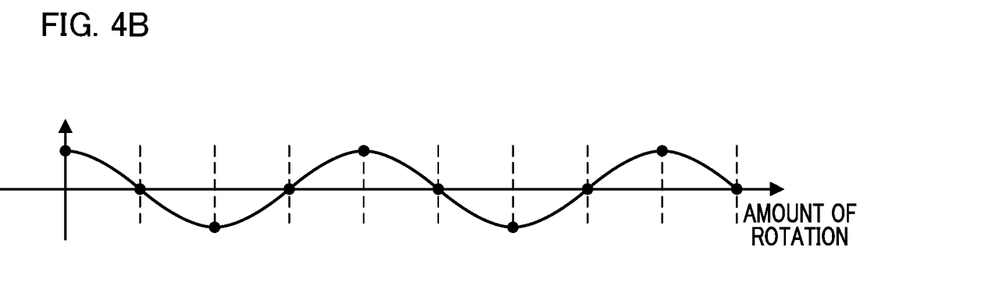
Figure 4C:
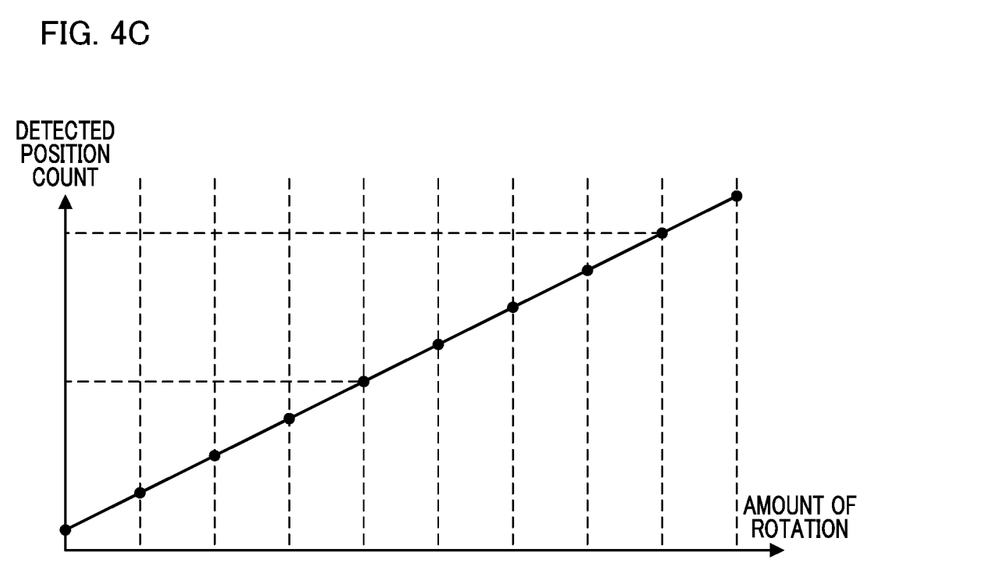

FIGS. 4A to 4C are diagrams showing the relationship between the detected signals and the rotational position information. FIGS. 4A and 4B show signals obtained by adjusting the detected Hall element signals, where the horizontal axis represents the amount of rotation. In the present embodiment, it is assumed that the position can be detected with a position resolution of 1024 counts when the two Hall element signals output one wavelength of a sinusoidal wave. The Apos generation unit 301 outputs signals as shown in FIG. 4C and FIG. 3B.

Subsequently, the Bpos generation unit 302 generates an output Bpos (FIG. 3C) having an arbitrary offset value with respect to the output Apos of the Apos generation unit 301 (FIG. 3B) and resets Bpos to zero for each rotation.

Figure 3C:
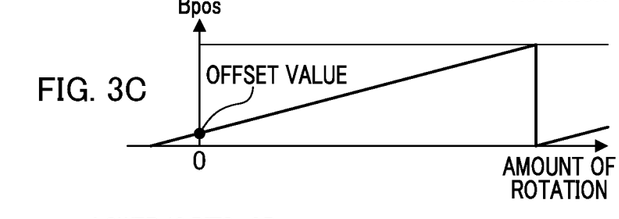
FIG. 3C is a diagram showing the output of a Bpos generation unit 302.

The CPU 111 can rewrite the output Bpos with an arbitrary value at an arbitrary timing and the difference amount between the rewritten value and Apos is recorded as an offset value at the rewritten timing.

Subsequently, the generated Bpos information is delivered to the drive waveform phase determination unit 303. The drive waveform phase determination unit 303 finally determines phase count information of drive waveforms to be applied to an A-phase coil 114 and a B-phase coil 115 of FIG. 1 and sends a PWM value corresponding to the phase count to a PWM generator 112.

The drive waveform phase determination unit 303 can switch between OPEN driving of outputting phase count information and position interlocked driving (CLOSED driving) of outputting phase count information based on the value of Bpos according to a command from an OPEN driving count unit 304. The CPU 111 can perform this switching between OPEN driving and position interlocked driving by setting the switching in the drive waveform phase determination circuit.

In the case of performing OPEN driving, the CPU 111 sets the frequency of drive waveforms in the OPEN driving count unit 304 and sets the amplitude gain of the drive waveforms in the drive waveform phase determination unit 303. This allows the drive waveform phase determination unit 303 to output drive waveforms having a desired frequency and a desired amplitude.

Figures 3D, 3E:
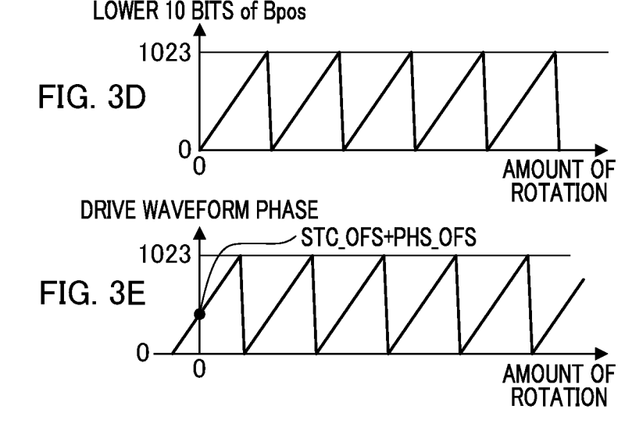

In the case of performing position interlocked driving, the CPU 111 calculates an STC_OFS value that is set through the stationary phase difference setting unit 305 with respect to a lower 10-bit value of Bpos (FIG. 3D). The CPU 111 also calculates a PHS_OFS value that is set through the driving phase difference setting unit 306. Then, the CPU 111 calculates a value that has been offset by these offsets (FIG. 3E). The calculated value (FIG. 3E) is the count value of the drive waveform phase and an output value of the phase corresponding to this count value is selected as an output value of the drive waveform.

As a result, both the offsets STC_OFS and PHS_OFS are added to Bpos such that Bpos is offset by them, although only one of the offsets STC_OFS and PHS_OFS may be added. STC_OFS is assigned a role of managing the stable positions of the detected position count and the drive waveform count and PHS_OFS is assigned a different role of managing the phase difference for torque generation.

Further, when the phase difference set in the driving phase difference setting unit 306 has been changed to a new phase difference, the phase difference is changed to the new phase difference over a certain period of time rather than being instantaneously switched to the new phase difference. The drive waveform generation circuit has a function of gradually increasing or decreasing the phase difference that reflects the new phase difference in the system. This function can be enabled/disabled by the CPU 111, and the change period of time of the function of gradually increasing or decreasing the phase difference is set by the driving phase difference change time setting unit 307 of FIG. 3A. The value that the CPU sets for the driving phase difference change time setting unit 307 is PS_TIME and it is assumed that the value of PS_TIME indicating the change period of time can be set in milliseconds.

The components from the drive waveform phase determination unit 303 to the driving phase difference change time setting unit 307 corresponding to the drive waveform generation circuit 110 have been described above and the description will now return to FIG. 1.

Figure 5A:
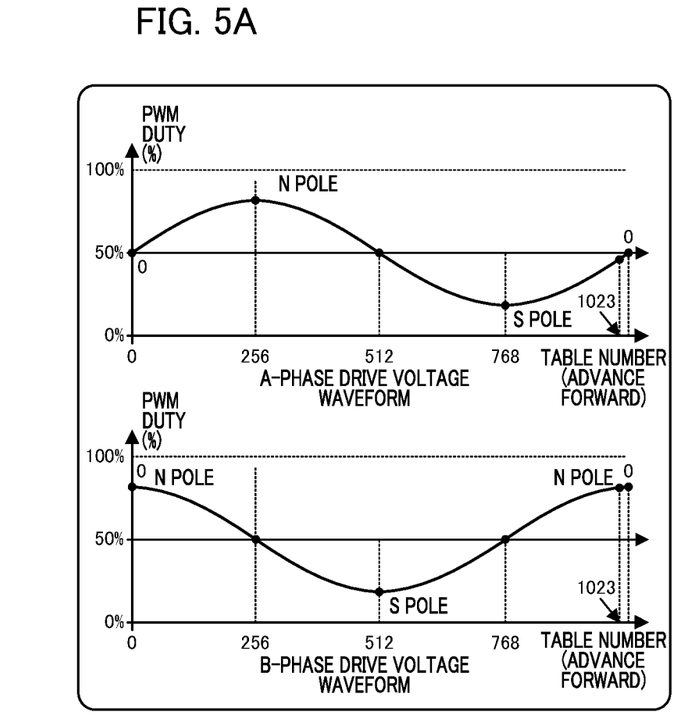
FIG. 5A is a diagram showing a case where the horizontal axis is counted forward, a B-phase signal leads an A-phase signal by 90 degrees, and the motor rotates in a clockwise (CW) direction.
Figure 5B:
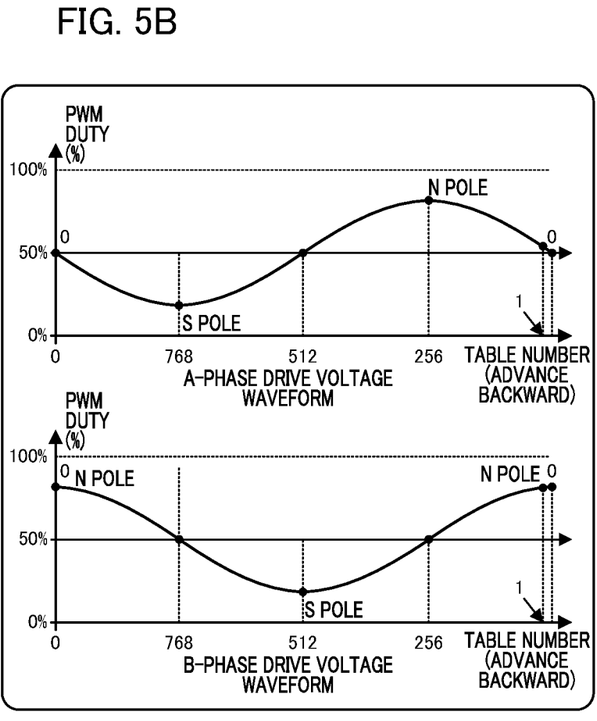
FIG. 5B is a diagram showing a case where the horizontal axis is counted backward, the A-phase signal leads the B-phase signal by 90 degrees, and the motor rotates in a counterclockwise (CCW) direction.

According to PWM command values output from the drive waveform generation circuit 110, the PWM generator 112 outputs corresponding PWM signals to the motor driver 113. FIGS. 5A and 5B are diagrams showing the relationship between drive waveforms and PWM in the first embodiment. In FIGS. 5A and 5B, the horizontal axis represents a table number with the same resolution of 1024 as that of the value output in FIG. 3E and the vertical axis represents the duty percentage of the PWM signal. FIG. 5A shows a case where the horizontal axis is counted forward, the B-phase signal leads the A-phase signal by 90 degrees, and the motor rotates in a clockwise (CW) direction.

FIG. 5B shows a case where the horizontal axis is counted backward, the A-phase signal leads the B-phase signal by 90 degrees, and the motor rotates in a counterclockwise (CCW) direction. Although the value of a percentage on the vertical axis increases or decreases according to the set gain value from the CPU 111, it is assumed in the present embodiment that an appropriate value has been set for rotational movement of the motor.

The motor driver 113 amplifies command values output from the PWM generator and applies a voltage corresponding to the A-phase signal and a voltage corresponding to the B-phase signal to the A-phase coil 114 and the B-phase coil 115, respectively.

The applied signals are high-frequency pulsed voltage signals according to the PWM signals, while current signals generated in the coils are identical to application of LPFs due to L components of the coils. Thus, it is effectively assumed that voltages in the shape of sinusoidal wave signals shown in FIGS. 5A and 5B are applied to the coils.

Stators A+ 116 and stators A− 117 function to concentrate and release magnetic fields generated at both ends of the A-phase coil. Stators B+ 118 and stators B− 119 function to concentrate and release magnetic fields generated at both ends of the B-phase coil.

The positional relationship between the stators A+ 116, the stators A− 117, the stators B+ 118, the stators B− 119, and the rotor magnet 120 will be described with reference to FIG. 2C. The stators A+ 116, the stators A− 117, the stators B+ 118, and the stators B− 119 are in a positional relationship of being displaced by a physical angle of 18 degrees and a total of five sets of the stators are arranged. The rotor magnet 120 is located at the center of the stator group and has a total of ten poles with five N poles and five S poles. Each time one sinusoidal wave of a drive waveform is output, the rotor rotates by a physical angle of 72 degrees.

Figure 6A:
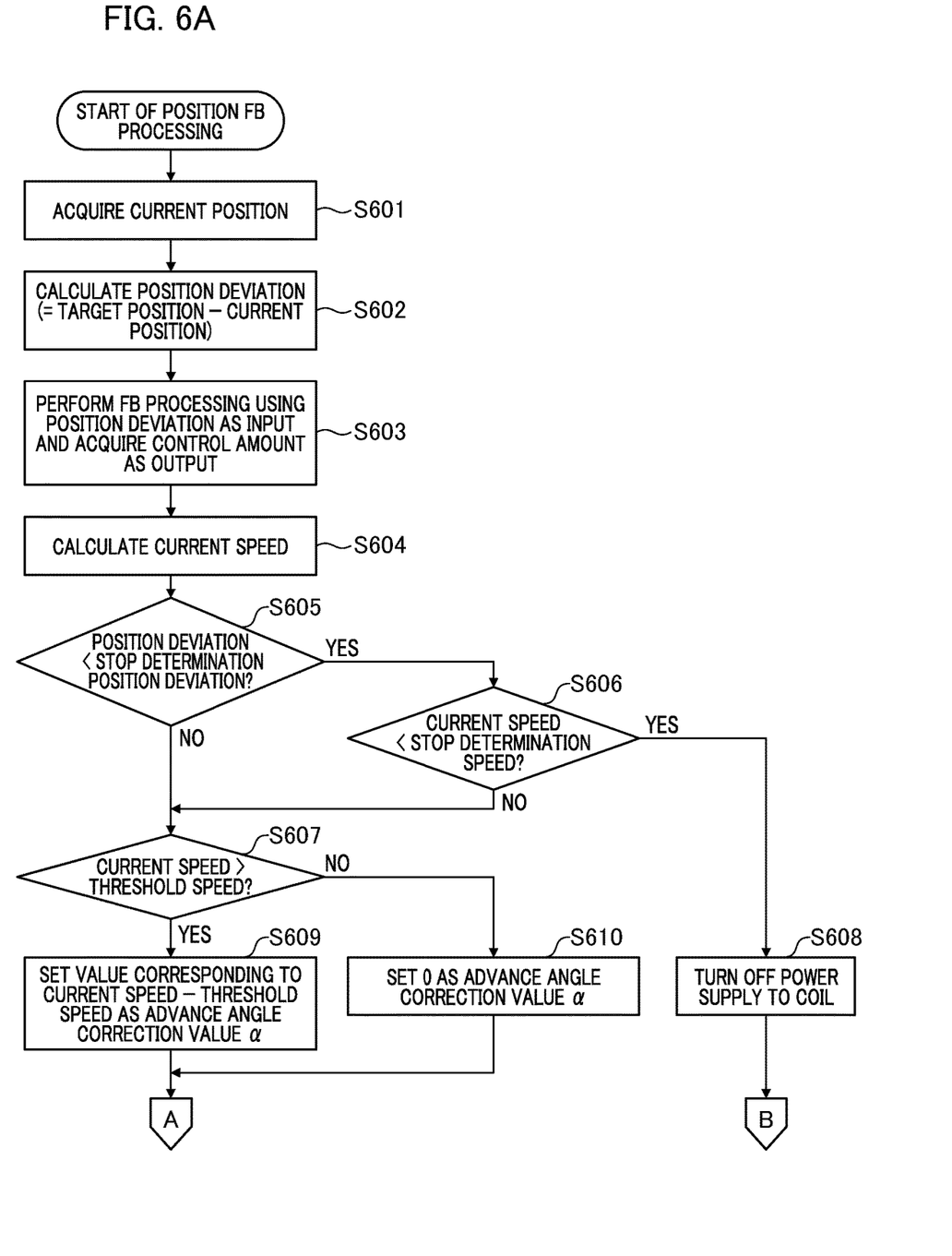
FIG. 6A is a flowchart showing a former part of the flow of a process of the first embodiment.
Figure 6B:
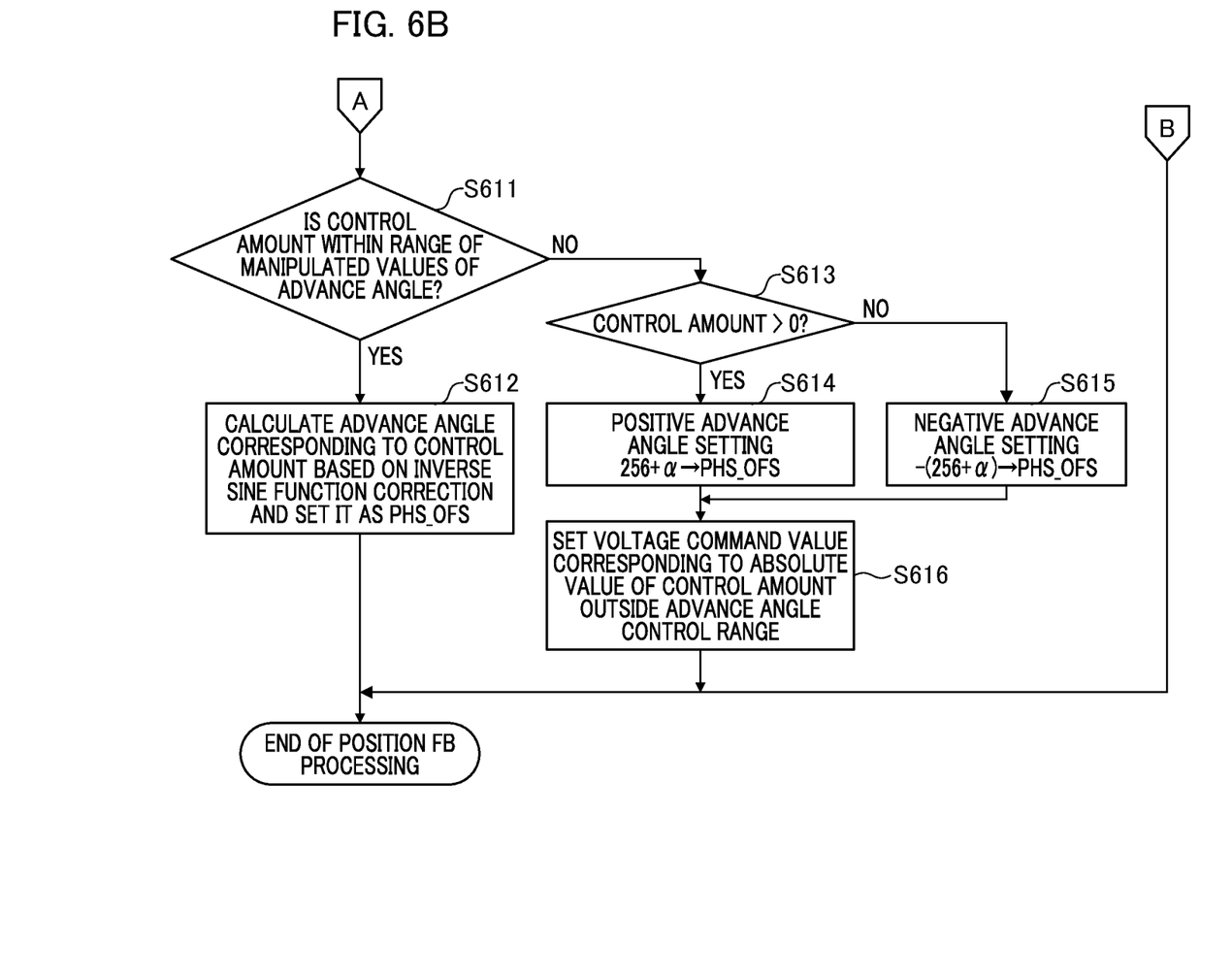
FIG. 6B is a flowchart showing a latter part of the flow of a process of the first embodiment.

FIG. 6 is a flowchart showing a flow of a process of the present embodiment. Hereinafter, the flow of the process of FIG. 6 will be described. The process of FIG. 6 is realized by the CPU 111 executing a computer program read from a memory (not shown). Here, the CPU 111 functions as a motor control unit.

In step S601, a current position is acquired. This means in the configuration of the block diagram of FIG. 1 that the CPU 111 acquires a value into which the position ENC circuit 109 has encoded position signals obtained from the Hall elements 105 and 106. In the subsequent step S602, a position deviation which is the difference between a target position and the current position is calculated. In the subsequent step S603, feedback (FB) control processing is performed using the position deviation as an input signal value to calculate a control amount as an output.

The above process will be described with reference to FIGS. 7A to 7D. FIGS. 7A to 7D are diagrams showing the relationship between an advance angle, a voltage, a torque, and the like. FIG. 7B is a block diagram showing the overall concept of the motor control device. The position deviation, which is the difference between a target position 704 and the current position which is the output of the position sensors (position detection unit) 709, is fed back and input to a controller 705 which calculates a control amount (an output control amount). The controller 705 sends control signals of an advance angle and a voltage to the coil 706. As a result, a current flowing through the coil 706 is controlled, an electromagnetic force corresponding to the current acts on a magnet 707 that is a rotor magnet, and the rotation of a rotor shaft 708 of the motor is controlled. The controller may be a general proportional-integral-differential (PID) controller, a phase lead/lag compensator, or another controller. Two values of the motor which can be controlled by this control amount are a voltage and an advance angle. How to allocate the control amount to these two values will be described in steps S605 to S616 in FIG. 6.

In step S604, a current speed is calculated. This is calculated through differentiation of detected position information, although filter processing or the like may be performed if necessary. In the subsequent step S605, the position deviation is compared with a predetermined stop determination position deviation. If the position deviation is smaller, the process proceeds to step S606, and if the position deviation is greater, the process proceeds to step S607. In step S606, the current speed is further compared with a predetermined stop determination speed. If the current speed is lower, the process proceeds to step S608, and if the current speed is higher, the process proceeds to step S607. In step S608, power supply to the motor coil is turned off and the process ends. In this way, power supply to the motor is turned off on condition that the deviation is smaller than the predetermined value.

In step S607, it is determined whether the current speed is equal to or higher than a predetermined threshold speed. If the current speed is higher, the process proceeds to step S609, and if the current speed is lower, the process proceeds to step S610. In step S609, an advance angle correction value α is determined based on an excess speed indicating how much the current speed exceeds the threshold speed. That is, a correction unit that corrects a predetermined range of the advance angle according to the speed is provided. The advance angle correction value α is determined from the excess speed based on table data or a relational expression indicating the relationship between the speed and the advance angle correction value α which is stored and held in the memory in advance.

In step S610, 0 is set as the advance angle correction value α, assuming that there is no excess speed. In the subsequent step S611, it is determined whether or not the control amount calculated in step S603 is within a range of manipulated amounts of the advance angle (a predetermined advance angle range of −90 to +90 degrees in the present embodiment). If the control amount is within the range of manipulated amounts, the process proceeds to step S612, and if not, the process proceeds to step S613. Here, the relationship between the advance angle, a set value of the voltage, and a generated torque will be described with reference to FIGS. 7A to 7D.

Figure 7A:
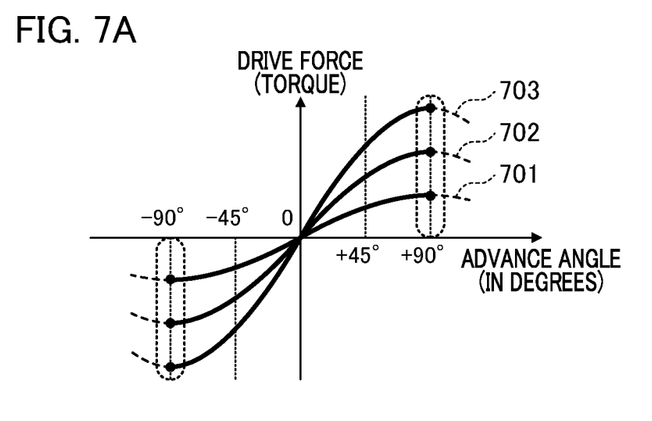
FIG. 7A is a relationship diagram in which the horizontal axis represents the advance angle (in degrees) and the vertical axis represents the drive force (torque) generated in the motor.
Figure 7B:
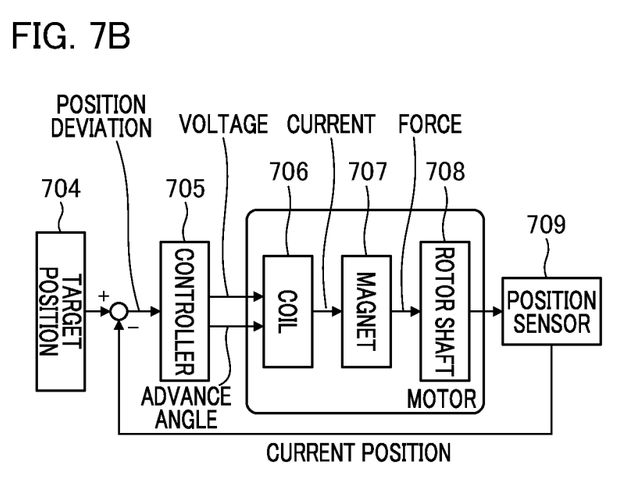
FIG. 7B is a block diagram showing the overall concept of the motor control device.

The graph of FIG. 7A is a relationship diagram in which the horizontal axis represents the advance angle (in degrees) and the vertical axis represents the drive force (torque) generated in the motor. As indicated by torque curves 701 to 703, there is a sinusoidal relationship between a given advance angle and the generated drive force, the positive drive force is maximum at +90 degrees, and the negative drive force is maximum at −90 degrees. When the absolute value of the advance angle exceeds 90 degrees, the torque enters a region indicated by a broken line of the torque curve and decreases. The advance angle value and the generated torque also have a non-linear relationship in the advance angle range of −90 to +90 degrees.

Figure 7C:
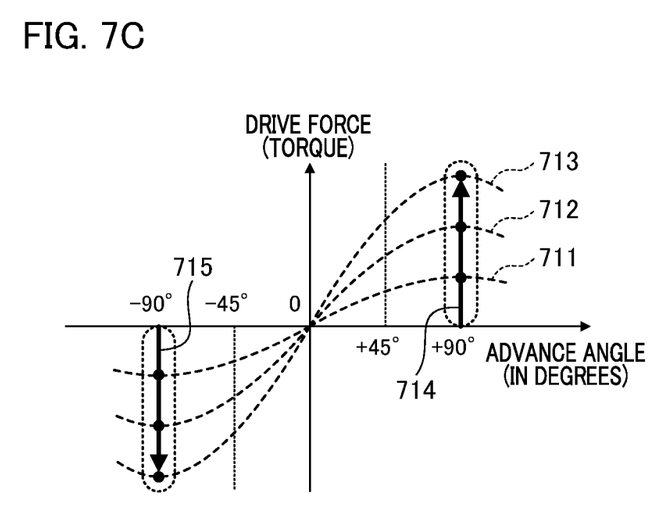
FIG. 7C is a relationship diagram in which the horizontal axis represents the advance angle (in degrees) and the vertical axis represents the drive force (torque) generated in the motor.

When a set voltage applied to the coil is considered, the torque basically increases or decreases in proportion to the set voltage. The torque curves 701, 702, and 703 in FIG. 7 represent changes in the torque curves when the set voltage is changed to single, double, and triple, respectively. Similar to the graph of FIG. 7A, FIG. 7C is a relationship diagram in which the horizontal axis represents the advance angle (in degrees) and the vertical axis represents the drive force (torque) generated in the motor. Here, torque curves 711, 712, and 713 of FIG. 7C are similar to the torque curves 701, 702, and 703 of FIG. 7C. Straight lines 714 and 715 are images of the drive force (torque) when the set voltage value is increased with the advance angle fixed at +90 degrees and −90 degrees, respectively.

Figure 7D:
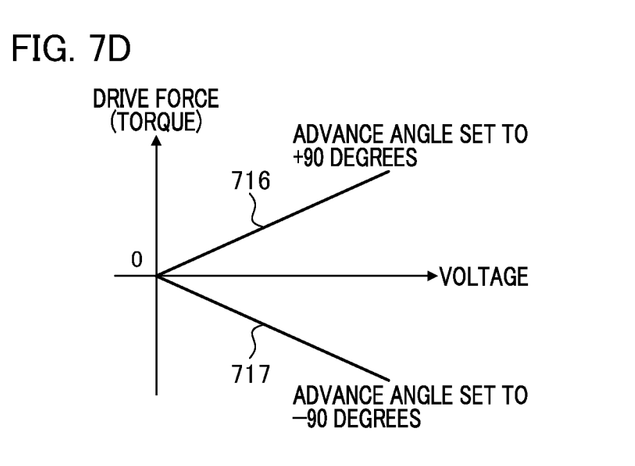
FIG. 7D is a diagram in which the horizontal axis represents a set voltage value and the vertical axis represents the drive force (torque).

FIG. 7D shows the two straight lines 714 and 715 by a graph with the horizontal axis changed to represent the set voltage value. In the graph of FIG. 7D, the horizontal axis represents the set voltage value, the vertical axis represents the drive force (torque), the straight line 716 corresponds to the straight line 714, and the straight line 717 corresponds to the straight line 715. In this way, the voltage is controlled with a fixed advance angle which is set such that the sign of the advance angle is inverted according to the direction of a drive force desired to be generated with the absolute value of the advance angle remaining unchanged, thereby achieving a linear relationship between the input and output values.

With the above description as a background, the description will now return to the process of step S612 in the flowchart of FIG. 6. In step S612, an advance angle value corresponding to the control amount is calculated based on correction using the inverse sine (arcsine) function and the calculated advance angle value is set as PHS_OFS.

Figure 8A:
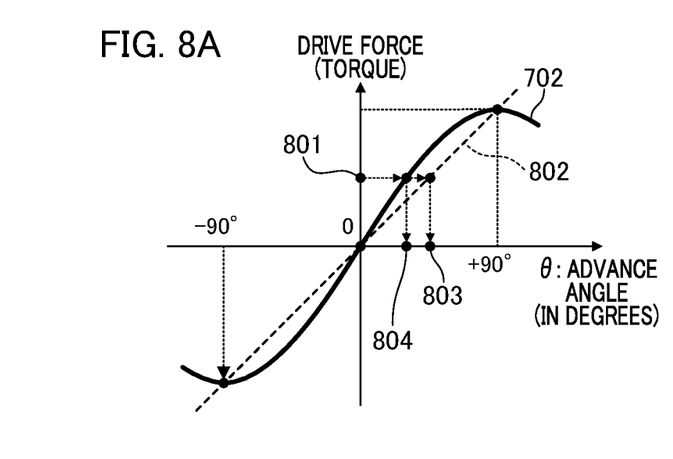
FIG. 8A is a diagram showing that the amount of generated torque obtained from the control amount is within a range of the amounts of torque corresponding to a range of −90 to +90 degrees.
Figure 8B:
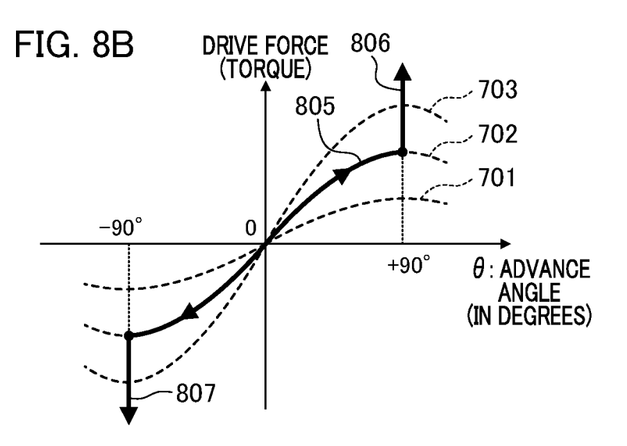
FIG. 8B is a diagram showing processes performed in steps S613 to S616.
Figure 8C:
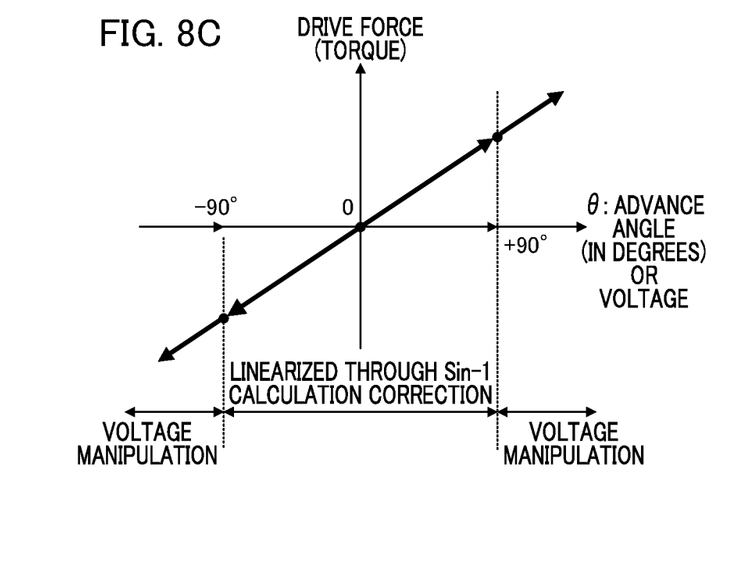
FIG. 8C is a diagram for conceptually explaining processes performed in steps S611 to S616.

FIGS. 8A to 8C are diagrams showing the relationship between the control amount, the advance angle, the voltage, and the torque in the first embodiment. The above process will be described with reference to FIG. 8A. In the process of step S612, the control amount is within the range of manipulated amounts of the advance angle. This means that the amount of generated torque obtained from the control amount is within a range of the amounts of torque corresponding to the range of −90 to +90 degrees in FIG. 8A. In the present embodiment, basically, the advance angle is changed with respect to the control amount, while the voltage is changed when the advance angle cannot be changed. Thus, the voltage gain is temporarily set to a fixed value. In the present embodiment, it is assumed that a voltage gain generated according to the torque curve 702 shown in FIG. 7A is set. It is also assumed that a designated control amount in FIG. 8A is an amount that generates a torque 801.

In this case, if a set advance angle value is determined through linear processing which is control processing performed in general, an advance angle 803 corresponding to the torque 801 will be selected according to a linear torque approximation 802. If the advance angle 803 is set, a torque greater than the intended torque 801 will be generated because the actual torque is determined according to the torque curve 702. Therefore, in step S612, processes of calculating an inverse sine (arcsine) function in advance and selecting an advance angle 804 based on the correspondence between the torque 801 and the torque curve 702 in FIG. 8A are performed. By performing these processes, it is possible to appropriately select a generated torque obtained in correspondence with the control amount and a set advance angle value corresponding to the generated torque. A value corresponding to this advance angle value is set as PHS_OFS.

In step S613, it is determined whether or not the control amount calculated in step S603 is greater than 0. If the control amount is greater, the process proceeds to step S614 since this is the case of giving a torque in a positive direction, and if the control amount is smaller, the process proceeds to step S615 since this is the case of giving a torque in a negative direction. In step S614, the advance angle value is set to a positive value in order to generate a positive torque. Specifically, a value of 256+α (where α is an advance angle correction value) is set as PHS_OFS to generate a phase difference between the detected phase position and the drive waveform phase. In step S615, the advance angle value is set to a negative value in order to generate a negative torque.

Specifically, a value of −(256+α) (corresponding to −90 degrees in the present embodiment) is set as PHS_OFS to generate a phase difference between the detected phase position and the drive waveform phase.

In the subsequent step S616, the absolute value of the control amount which is outside the advance angle control range determined in step S611 is obtained and a voltage command value is set according to the absolute value. The processing performed in steps S613 to S616 above will be described with reference to FIG. 8B. The description will proceed assuming that the advance angle correction value α is 0 for the sake of simplicity.

In step S612, torque control along a sine curve like a torque curve 805 in FIG. 8B is performed according to advance angle control. On the other hand, if the process proceeds to step S614, the advance angle is set to +90 degrees at a right end of the torque curve 805 in FIG. 8B. Then, the set voltage value is increased to increase the absolute value of the torque as in a straight line 806. As torque curves 701 to 703 are indicated by dotted lines in FIG. 8B, the torque linearly increases and decreases as the set voltage value increases and decreases as described above. Thus, if a requested torque cannot be set through advance angle setting, the requested torque is adjusted through voltage setting. Similarly, if the process proceeds to step S615, the advance angle is set to −90 degrees at a left end of the torque curve 805 in FIG. 8B and the set voltage value is increased to increase the absolute value of the torque the torque as in a straight line 807.

FIG. 8C is a diagram conceptually showing the processing shown in steps S611 to S616. A supplementary description of FIG. 8C will be given, assuming that the horizontal axis represents an advance angle or a voltage. When the advance angle is within the range of −90 to +90 degrees, inverse sine function correction is applied with the motor drive voltage fixed to change the advance angle such that the input/output relationship is linear. When the advance angle is outside the range of −90 to +90 degrees, the set voltage value is increased with the advance angle fixed to generate a torque corresponding to the requested control amount.

That is, an output control amount for the motor is calculated based on the deviation from the target position of the object to be driven by the motor. Further, according to the output control amount, the advance angle in the rotational phase of the motor is changed when the advance angle is within a predetermined advance angle range in the rotational phase of the motor and the drive voltage of the motor is changed with the advance angle fixed when the advance angle is outside the predetermined advance angle range. When the advance angle is within the range of −90 to +90 degrees, the advance angle may be mainly changed, while the drive voltage may be slightly changed rather than being completely fixed. On the other hand, when the advance angle is outside the range of −90 to +90 degrees, the voltage may be mainly changed, while the advance angle may be slightly changed rather than being completely fixed.

By repeating the above processing at regular intervals, it is possible to provide a motor drive device that enables highly responsive and detailed position control using a motor with a configuration of inexpensive members.

Second Embodiment

A second embodiment will be described with regard to position control where a plurality of motor drive devices described in the first embodiment are used to translate and rotate a target member on a two-dimensional plane.

Figure 9:
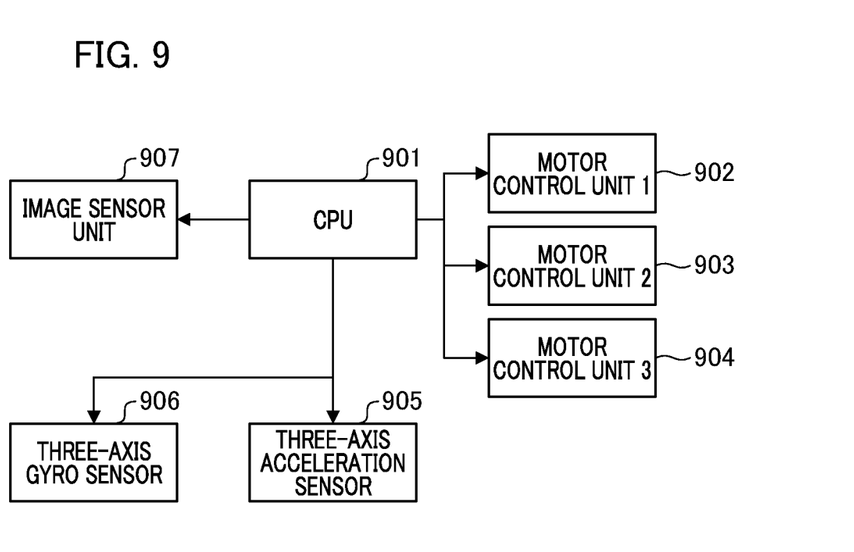
FIG. 9 is a block diagram showing an outline of a system according to a second embodiment of the present disclosure.

FIG. 9 is a block diagram showing an outline of a system according to the second embodiment. An imaging device such as a camera is assumed in the present embodiment. Of components of the imaging device, only those relating to implementation of the present embodiment are shown in FIG. 9. A CPU 901 is similar to the CPU 111 in the block diagram of FIG. 1 and serves to acquire various data such as a computer program stored in a memory (not shown), perform arithmetic processing based on the data, and control each part.

Three motor control units 902 to 904 have the same configuration, and it is assumed that the configurations of the motor control units 902 to 904 are each identical to the configuration shown in the block diagram of FIG. 1 from which only the CPU 111 is removed. A three-axis acceleration sensor 905 is a sensor that can detect the acceleration states of the imaging device in three-dimensional directions. A three-axis gyro sensor 906 is a sensor that can acquire gyro (angular velocity) information in three-axis directions of the imaging device. The three-axis acceleration sensor 905 and the three-axis gyro sensor 906 detect the amount of shake of a housing of the imaging device and thus constitute a shake amount detection unit. An image sensor unit 907 includes an imaging element such as a CMOS image sensor that converts an optical signal into an electric signal in the imaging device. In the present embodiment, the image sensor unit 907 is held by the configuration of the motor control units 902 to 904 and can translate and rotate according to movement of the motor control units 902 to 904.

The components from the motor control unit 902 to the image sensor unit 907 can perform bidirectional communication with the CPU 901 such as information acquisition and instruction-related communication.

Figure 10A:
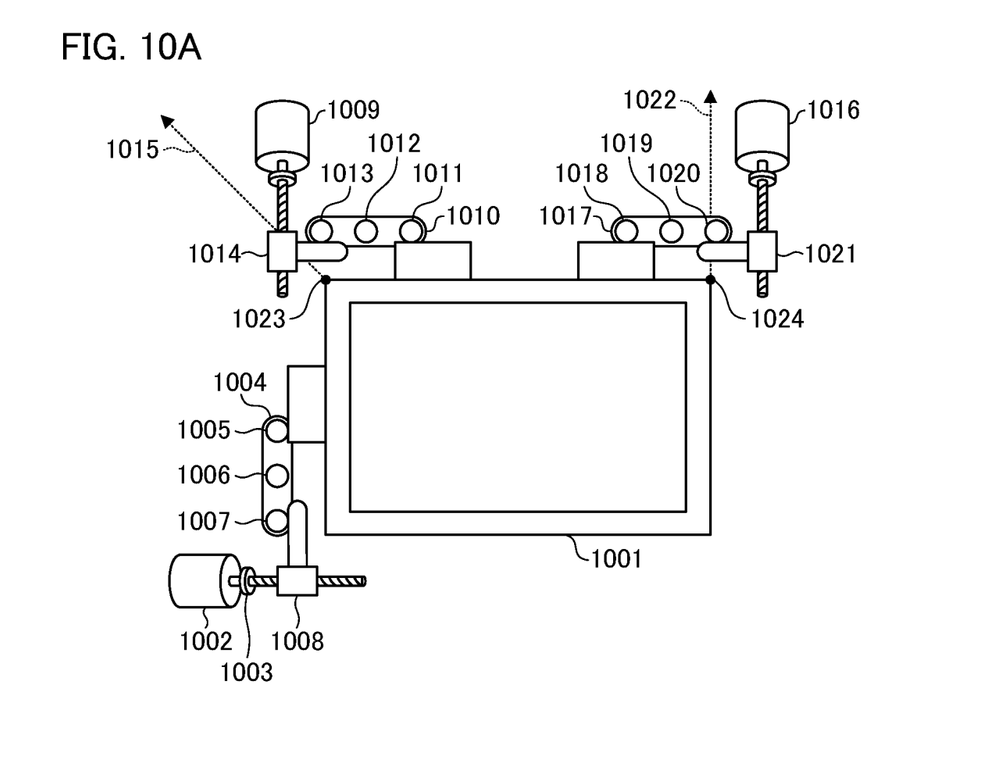
FIG. 10A is a diagram for explaining a detailed configuration of mechanical members which enables translation and rotation of an image sensor unit 907 shown in FIG. 9
Figure 10B:
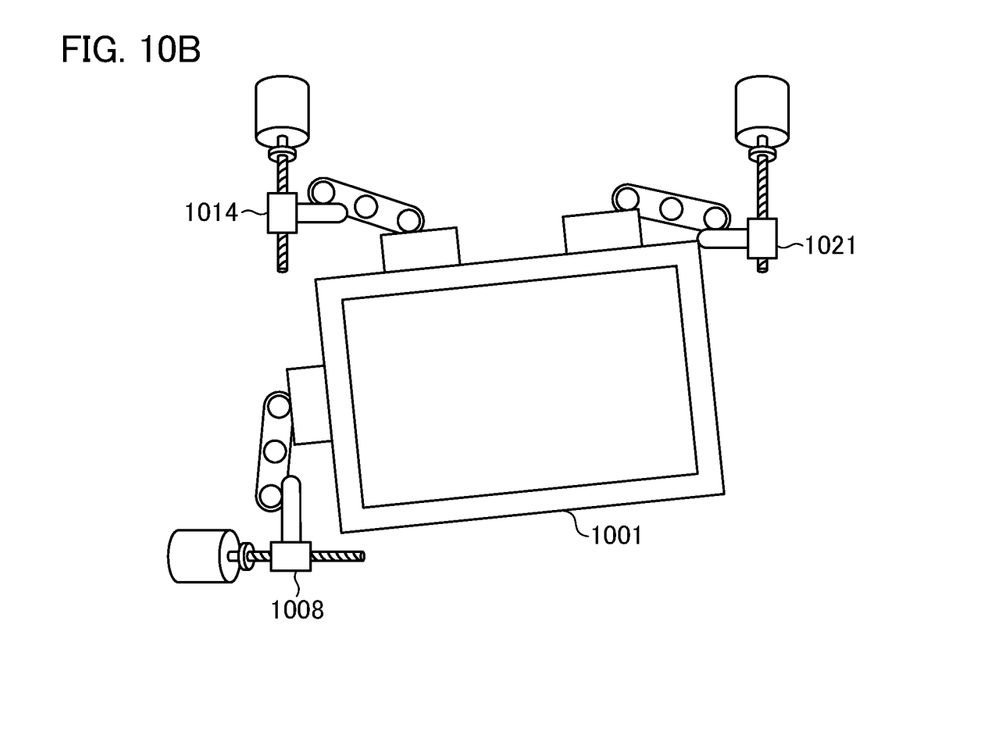
FIG. 10B is a diagram showing an example in which screw engaging members 1008, 1014, and 1021 have moved from their reference positions shown in FIG. 10A.

FIGS. 10A and 10B are diagrams showing an outline of a mechanical mechanism of a system according to the second embodiment. FIG. 10A shows a detailed configuration of mechanical members which enables translation and rotation of the image sensor unit 907 shown in FIG. 9. In FIG. 10A, an image sensor unit member 1001 includes a frame or the like accommodating the image sensor unit 907 and is biased by springs in directions 1015 and 1022 at bias points 1023 and 1024, respectively.

The image sensor unit member 1001 is in contact with action point members 1005, 1011, and 1018 and the position thereof is determined by both the contact with these three points and the biasing force of the springs. A motor 1002 and an ENC magnet 1003 are similar to the motor 101 and the ENC magnet 103 in FIG. 2. Although members such as wiring and sensors are actually present, they are omitted because they are not necessary for the description of the mechanical configuration of FIG. 10. A lever member 1004 is provided with a fulcrum member 1006 and a force point member 1007 in addition to the action point member 1005 described above.

The lever member 1004 is configured to be rotatable around the fulcrum member 1006. When the force point member 1007 moves under a force, the action point member 1005 applies the force to the image sensor unit member 1001 due to rotation of the lever member 1004. In addition, a screw engaging member 1008 engaged with a screw provided on the shaft of the motor is configured to move as the motor 1002 rotates to apply a force to the force point member 1007. Reference numerals 1009 and 1016 in FIG. 10A denote motors and the configurations of components 1010 to 1014 and 1017 to 1021 are the same as the configurations of the components 1004 to 1008 and therefore detailed description thereof will be omitted.

FIG. 10B shows an example in which the screw engaging members 1008, 1014, and 1021 have moved from their reference positions shown in FIG. 10A. It can be seen that the image sensor unit member 1001 has translated or rotated within the imaging plane according to the positions of the screw engaging members 1008, 1014, and 1021.

Figure 11:
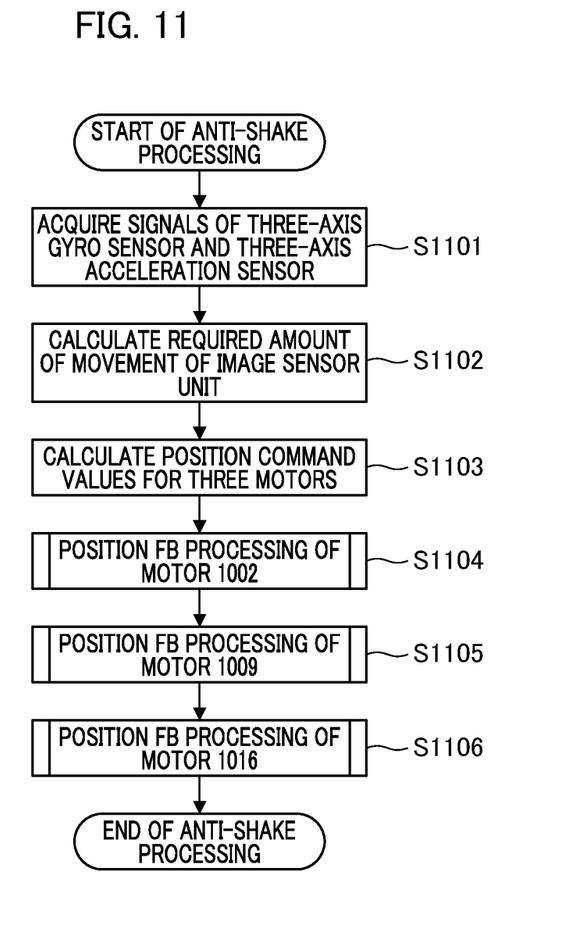
FIG. 11 is a flowchart showing a flow of a process of the second embodiment.

FIG. 11 is a flowchart showing a flow of a process of the second embodiment. Hereinafter, the flow of the process of FIG. 11 will be described assuming the configurations shown in FIGS. 9 and 10.

In step S1101, signals from the three-axis acceleration sensor 905 and the three-axis gyro sensor 906 are acquired. In the subsequent step S1102, a positional shake amount and an angular shake amount of the entirety of the imaging device are calculated based on information obtained in step S1101. Then, a target position is calculated according to these shake amounts and the amount of two-dimensional movement of the image sensor unit member 1001 indicating how much it is to be moved and the direction thereof are calculated. With regard to a specific algorithm used in this calculation, various methods have been disclosed in the known art and thus details thereof are omitted.

In step S1103, amounts indicating how much the screw engaging members 1008, 1014, and 1021 need to move are calculated according to the amount and direction of two-dimensional movement of the image sensor unit member 1001 calculated in step S1102. Rotational position command values indicating how much the motors 1002, 1009, and 1016 are to rotate are calculated according to the calculated amounts. In the subsequent steps S1104, S1105, and S1106, position feedback (FB) control processes for the motors 1002, 1009, and 1016 are performed, respectively.

These processes are the same as those shown in the first embodiment. Here, it is assumed that processes for appropriately changing the advance angle and the voltage for movement to the target position based on the deviation between the current position and the target position are performed.

By repeating the above processing at regular intervals, it is possible to provide a motor drive device which can perform an appropriate shake correction process on the image sensor unit member in the imaging device. In the above embodiment, the image sensor unit member 1001 including the imaging element is driven by the motor drive device to perform shake correction. However, an optical system for guiding light to the imaging element may be driven by the motor drive device to perform shake correction.

Further, both the image sensor unit member 1001 and the optical system may be driven to perform shake correction. Although the position detection unit of the present embodiment uses the configuration using the Hall elements and the rotary magnet, other sensor mechanisms may be used as long as the rotational position can be detected with sufficiently high accuracy. Further, for example, a general claw-pole type stepping motor having ten poles is assumed as the motor 101 in the present embodiment. However, the present embodiment can be implemented using a rotary motor having a different configuration as long as this configuration enables control to be performed with necessary accuracy.

While the present disclosure includes exemplary embodiments, it is to be understood that the disclosure is not limited to the disclosed exemplary embodiments. The scope of the following claims is to be accorded the broadest interpretation so as to encompass all such modifications and equivalent structures and functions.

A computer program for realizing all or part of the control in the embodiments and the functions of the embodiments described above may be provided to the motor drive device via a network or various storage media. Then, a computer (or a CPU, an MPU, or the like) in the motor drive device may read and execute the program. In that case, the program and a storage medium storing the program form an embodiment of the present disclosure.

This application claims the benefit of Japanese Patent Application No. 2019-207645, filed on Nov. 18, 2019, which is hereby incorporated by reference herein in its entirety.

What is claimed is:

1. A motor drive device comprising at least one processor or circuit configured to function as:
 a position detection unit configured to detect a current position of an object to be driven by a motor;
 a position deviation calculation unit configured to calculate a position deviation amount between the current position and a target position of the object to be driven by the motor; and
 a motor control unit configured to change an advance angle in a rotational phase of the motor according to the control amount calculated based on the position deviation amount, wherein the motor control unit changes the advance angle in a case where the control amount calculated based on the position deviation amount is within a predetermined range and changes a drive voltage of the motor with the advance angle fixed in a case where the control amount calculated based on the position deviation amount is outside the predetermined range.

2. The motor drive device according to claim 1, wherein the motor control unit is configured to perform feedback control based on the output control amount.

3. The motor drive device according to claim 1, wherein the motor control unit is configured to turn off power supply to the motor in a case where the deviation is smaller than a predetermined value.

4. The motor drive device according to claim 1, wherein the motor control unit is configured to turn off power supply to the motor in a case where a speed of the object to be driven by the motor is smaller than a predetermined value.

5. The motor drive device according to claim 1, wherein the predetermined advance angle range is a range of −90 to +90 degrees.

6. The motor drive device according to claim 1, wherein the motor control unit is configured to change the advance angle in the rotational phase of the motor with the drive voltage of the motor fixed in a case where the advance angle is within the predetermined advance angle range.

7. The motor drive device according to claim 1, wherein the object to be driven by the motor includes a rotary magnet having a plurality of magnetic poles.

8. The motor drive device according to claim 7, wherein the position detection unit includes a plurality of Hall elements configured to detect the rotational phase of the rotary magnet.

9. The motor drive device according to claim 1, further comprising a correction unit configured to correct the predetermined advance angle range according to a speed of the object to be driven by the motor.

10. The motor drive device according to claim 9, further comprising a memory configured to hold a relationship between the speed of the object to be driven by the motor and the predetermined advance angle range.

11. The motor drive device according to claim 1, further comprising a shake amount detection unit configured to detect an amount of shake of a housing, wherein the motor control unit is configured to calculate the target position according to the amount of shake.

12. The motor drive device according to claim 11, wherein the object to be driven by the motor includes an image sensor or an optical system.

13. A motor drive method comprising:
detecting a current position of an object to be driven by a motor;
calculating a position deviation amount between the current position and a target position of the object to be driven by the motor; and
changing an advance angle in a rotational phase of the motor according to the control amount calculated based on the position deviation amount, wherein the advance angle is changed in a case where the control amount calculated based on the position deviation amount is within a predetermined range and a drive voltage of the motor is changed with the advance angle fixed in a case where the control amount calculated based on the position deviation amount is outside the predetermined range.

14. A non-transitory computer-readable storage medium that stores a computer program including instructions, which when executed by one or more processors, cause the one or more processors to perform operations comprising:
detecting a current position of an object to be driven by a motor;
calculating a position deviation amount between the current position and a target position of the object to be driven by the motor; and
changing an advance angle in a rotational phase of the motor according to the control amount calculated based on the position deviation amount, wherein the advance angle is changed in a case where the control amount calculated based on the position deviation amount is within a predetermined range and a drive voltage of the motor is changed with the advance angle fixed in a case where the control amount calculated based on the position deviation amount is outside the predetermined range.

* * * * *